(12) United States Patent
Anderson et al.

(10) Patent No.: US 12,704,553 B2
(45) Date of Patent: Aug. 11, 2026

(54) ADAPTIVE CHARGE CONTROL FOR TRANSPORT CLIMATE CONTROL APPLICATIONS

(71) Applicant: THERMO KING LLC, Minneapolis, MN (US)

(72) Inventors: Carolyn Anderson, Minneapolis, MN (US); Noah Lopez, Minneapolis, MN (US); Joshua Ramos, Bloomington, MN (US)

(73) Assignee: THERMO KING LLC, Minneapolis, MN (US)

(*) Notice: Subject to any disclaimer, the term of this patent is extended or adjusted under 35 U.S.C. 154(b) by 328 days.

(21) Appl. No.: 18/356,626

(22) Filed: Jul. 21, 2023

(65) Prior Publication Data

US 2025/0027999 A1 Jan. 23, 2025

(51) Int. Cl.

| | |
|---|---|
| ***G01R 31/382*** | (2019.01) |
| ***G01R 31/36*** | (2020.01) |
| ***H01M 10/44*** | (2006.01) |
| ***H02J 7/00*** | (2026.01) |
| ***H02J 7/14*** | (2006.01) |
| ***H02J 7/90*** | (2026.01) |

(52) U.S. Cl.

CPC ....... *G01R 31/382* (2019.01); *G01R 31/3648* (2013.01); *H01M 10/44* (2013.01); *H02J 7/14* (2013.01); *H02J 7/90* (2026.01); *H01M 2220/20* (2013.01)

(58) Field of Classification Search

CPC . G01R 31/382; G01R 31/3648; H01M 10/44; H01M 2220/20; H02J 7/007; H02J 7/14

See application file for complete search history.

(56) References Cited

U.S. PATENT DOCUMENTS

| | | | | |
|---|---|---|---|---|
| 9,428,073 | B2 * | 8/2016 | Baughman | B60L 3/0046 |
| 10,439,404 | B2 * | 10/2019 | Shen | H01M 10/441 |
| 10,596,917 | B2 * | 3/2020 | Conlon | B60L 53/14 |

(Continued)

OTHER PUBLICATIONS

Extended European Search Report, issued in the corresponding European patent application No. 24189755.2, dated Jun. 2, 2025, 9 pages.

*Primary Examiner* — Thomas D Alunkal

(74) *Attorney, Agent, or Firm* — HSML P.C.

(57) ABSTRACT

Methods and systems for operating a rechargeable energy storage source management system (RMS) to power a load while a power system is connected to an external power source are provided. One method includes determining a charger is connected to the external power source and enabled. The method also includes modulating a charger current from the charger to a rechargeable energy storage source management system (RMS). Also, the method includes modulating a rechargeable energy storage source (RESS) current provided by the RMS and configured to charge a RESS of the power system. Further, the method includes monitoring a RESS state of charge (SoC), monitoring the RESS current provided by the charger, and comparing the RESS SoC with a desired RESS SoC threshold. Upon the RESS SoC reaching the desired RESS SoC threshold, modulating the charger current for powering the load while avoiding decreasing the RESS SoC.

19 Claims, 11 Drawing Sheets

(56) References Cited

U.S. PATENT DOCUMENTS

| | | | | |
|---|---|---|---|---|
| 2016/0028255 | A1* | 1/2016 | Nishikawa | H02J 7/971<br>320/162 |
| 2017/0120775 | A1* | 5/2017 | Murata | B60L 58/27 |
| 2019/0084435 | A1* | 3/2019 | Grace | H02J 7/977 |
| 2019/0123574 | A1* | 4/2019 | Jung | H02J 7/92 |
| 2020/0274380 | A1* | 8/2020 | Moubedi | H02J 7/80 |
| 2021/0213797 | A1* | 7/2021 | Saroka | B60H 1/00014 |
| 2021/0213805 | A1 | 7/2021 | Saroka et al. | |
| 2022/0134900 | A1* | 5/2022 | Ward-Santos | B60L 53/62<br>320/109 |
| 2022/0169147 | A1* | 6/2022 | Huang | B60L 58/27 |
| 2023/0096878 | A1* | 3/2023 | Thomason | B60L 53/16<br>320/109 |
| 2023/0194615 | A1* | 6/2023 | Bednar | G01R 31/367<br>702/63 |

* cited by examiner 10
12
14
15
30
25
16
26
24
22
20
35
23

132
134
135
140
145
130

400
A
Charger enabled and connected to external power source?
410
No
Not applicable
411
Yes
Is the charger current below a charger current threshold?
420
Yes
D
No
Is current flowing to the RESS greater than a RESS current threshold?
425
No
Yes
C
Is RESS SoC greater than or equal to the desired SoC?
437
No
Yes
B RESS Current
RESS SoC (%)
Charger Output Current Setpoint
External Load Power (kW)
510
530
550
570
501
502
503
504

ADAPTIVE CHARGE CONTROL FOR TRANSPORT CLIMATE CONTROL APPLICATIONS

FIELD

This disclosure relates generally to a power system used to power, for example, a transport climate control system. More specifically, this disclosure relates to a method and system for adaptively charging a rechargeable energy storage source (RESS) while powering a load.

BACKGROUND

A transport climate control system can include, for example, a transport climate control system (TCS) and/or a heating, ventilation and air conditioning (HVAC) system. A TCS is generally used to control an environmental condition (e.g., temperature, humidity, air quality, and the like) within a cargo space of a transport unit (e.g., a truck, a container (such as a container on a flat car, an intermodal container, etc.), a box car, a semi-tractor, a passenger vehicle, or other similar transport unit). The TCS can maintain environmental condition(s) of the cargo space to maintain cargo (e.g., produce, frozen foods, pharmaceuticals, etc.). In some embodiments, the transport unit can include a HVAC system to control a climate within a passenger space of the vehicle.

SUMMARY

This disclosure relates generally to a power system used to power, for example, a transport climate control system. More specifically, this disclosure relates to a method and system for adaptively charging a RESS while powering a load.

A RESS management system (RMS) may be configured to sustain a limited number of switching between the charging and discharging modes before components of the power system wear out and potentially cause malfunctions to the power system. More specifically, toggling between the charging and the discharging mode can introduce wear to components of the RMS and cause the state of charge (SoC) of the RESS to exceed a predetermined safety threshold or fall below a useful life threshold. Avoiding frequent toggling between charging and discharging modes while powering a load, the RMS can extend the useful life of the RMS, extend the lifespan of the RESS, and maintain the capacity of the RESS.

Also, frequent switching between a charging mode and a discharging mode can increase the risk of errors of being in the incorrect mode. More complex control software may be required to mitigate this risk. Thus, limiting the amount and/or frequency of toggling between the charging mode and the discharging mode can increase the lifespan of the RMS and simplify the control software.

In an embodiment, when the external power source is providing power to the power system, the RMS is configured to remain in a charging mode regardless of whether the RESS is being charged such that toggling between a charging and a discharging mode may be avoided.

By avoiding the toggling between modes, components wearing down due to mode switching may be reduced, thereby improving the RMS lifespan and reliability.

Further, keeping the RESS in a charging mode can help maintain the RESS SoC at a desired RESS SoC once the RESS is charged. The embodiments described herein can minimize discharging and charging cycles of the RESS, increasing the amount/percentage of time that the RMS stays at the desired RESS SoC when compared to alternative approaches where toggling the RMS between discharging and charging modes can occur. By increasing the amount/percentage of time that RMS stays at the desired RESS SoC, the risk of the transport unit leaving a facility with less than a desired RESS SoC can be reduced.

Furthermore, the charging and discharging of a RESS at or near its desired RESS SoC can be less energy efficient than charging the RESS at a lower SoC. The embodiments described herein can avoid/reduce toggling between charging and discharging modes, often at or near the desired RESS SoC of the RESS, which can thereby increase energy efficiency of the power system.

In one embodiment, a method for operating a RESS management system to power a load, while a power system is connected to an external power source, is disclosed. The method includes determining a charger of the power system is connected to the external power source and the charger is enabled. The method also includes modulating a charger current from the charger to a rechargeable energy storage source management system (RMS) of the power system. Also, the method includes modulating a rechargeable energy storage source (RESS) current provided by the RMS and configured to charge a RESS of the power system. Further, the method includes monitoring a RESS state of charge (SoC), monitoring the RESS current provided by the charger, and comparing the RESS SoC with a desired RESS SoC threshold.

Upon the RESS SoC reaching the desired RESS SoC threshold, modulating the charger current for powering the load while avoiding decreasing the RESS SoC.

In another embodiment, a power system for powering a load while being connected to an external power source is disclosed. The power system includes a charger, a RMS, a RESS, and a controller. The charger is configured to connect the external power source to the RMS. The RMS is configured to modulate a charger current from the charger, the charger current being configured to provide electrical power to the power system, and configured to modulate a RESS current configured to charge the RESS. The RESS is configured to provide power to the load. The controller is configured to: determine that the charger is connected to the external power source and configured to determine that the charger is enabled; modulate the charger current from the charger to RMS; modulate the RESS current provided by the RMS and configured to charge or discharge a RESS of the power system; monitor a RESS state of charge (SoC); monitor the RESS current provided by the charger; compare the RESS SoC with a desired RESS SoC threshold; and, upon the RESS SoC reaching the desired RESS SoC threshold, modulate the charger current for powering the load while avoiding decreasing the RESS SoC.

BRIEF DESCRIPTION OF THE DRAWINGS

References are made to the accompanying drawings that form a part of this disclosure, and which illustrate embodiments in which the systems and methods described in this Specification can be practiced.

Like reference numbers represent like parts throughout.

DETAILED DESCRIPTION

Figure 1A:
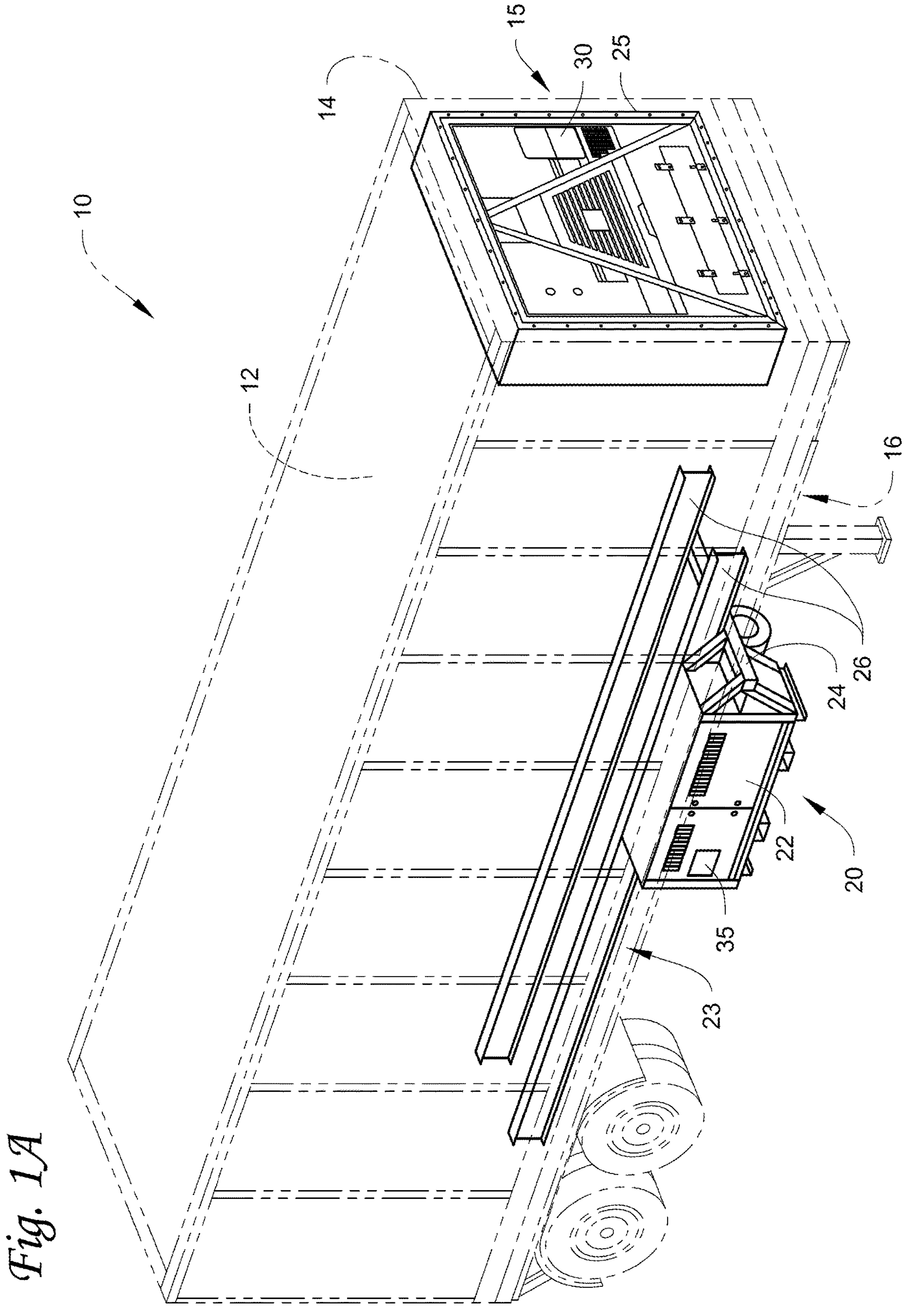
FIG. 1A illustrates a perspective view of a container that includes a transport climate control system, according to one embodiment.

This disclosure relates generally to a power system used to power, for example, a transport climate control system. More specifically, this disclosure relates to a method and system for adaptively charging a RESS while powering a load.

A transport climate control system is generally used to control one or more environmental conditions such as, but not limited to, temperature, humidity, air quality, or combinations thereof, within a climate controlled space of a transport unit. Examples of transport units include, but are not limited to a truck, a container (such as a container on a flat car, an intermodal container, a marine container, a rail container, etc.), a box car, a semi-tractor, a passenger vehicle (e.g., mass transit bus), or other similar transport unit. A climate controlled transport unit can be used to transport perishable items such as pharmaceuticals, produce, frozen foods, and meat products and/or can be used to provide climate comfort for passengers in a passenger space of a passenger vehicle. The transport climate control system may include a vapor-compressor type climate controlled system, a thermal accumulator type system, or any other suitable climate controlled system that can use a working fluid (e.g., refrigerant, etc.). In these embodiments, the transport climate control system may include thermal components (e.g., heater, radiator, etc.), cold plate technology, or the like. The transport climate control system may include other components (e.g., a fan, a pump, a controller, a Human-Machine-Interface device (HMI), a telematics device, or the like) that draw electrical power to operate the transport climate control system. In some embodiments, the transport climate control system includes, for example, a HVAC system for controlling the climate within a passenger space of a climate controlled transport unit. In these embodiments, the transport climate control system may include a vapor-compressor type HVAC system, a thermal accumulator type system, and/or any other suitable HVAC system, cold plate technology, thermal components, or the like.

The transport climate control system can include a climate control unit (CCU) attached to a transport unit and configured to control one or more environmental conditions (e.g., temperature, humidity, air quality, etc.) within a climate controlled space of the climate controlled transport unit. The CCU can include, without limitation, a compressor, a condenser, an expansion valve, an evaporator, and one or more fans or blowers to control the heat exchange between the air within the climate controlled space and the ambient air outside of the climate controlled transport unit.

A power system can supply some or all the power to one or more electrical loads of a transport unit including the transport climate control system during transport and/or while stationary at a facility (e.g., a warehouse, a power distribution site (a docking station, a storage, a charging station, a gas station, or the like), a shipyard, a supply yard, a rest stop, a parking infrastructure, etc.). During transport, the power system may power the one or more electrical loads by discharging the RESS of the power system. While stationary and connected to an electrical grid power source, the power system can transfer power from the electrical grid power source to power the one or more electrical loads and/or charge the RESS. In some embodiments, the power system can also transfer power from the RESS to power the one or more electrical loads.

It will be appreciated that the transport climate control system may be required to provide climate control while the transport unit is stationary and/or while the power system is connected to an external power source. Additionally, the transport climate control system may be required to charge the RESS while the one or more electrical loads are drawing power from the power system.

For example, when a climate controlled transport unit is a truck parked at a rest area overnight, the transport climate control system may provide climate control within a cabin of the truck. The RESS of the power system may also be charged.

As defined herein, "low voltage" refers Class A of the ISO 6469-3 in the automotive environment. In particular, a maximum working voltage of between 0V and 60V DC or between 0V and 30V AC.

As defined herein, "high voltage" refers Class B of the ISO 6469-3 in the automotive environment. In particular, a maximum working voltage of between 60V and 1500V DC or between 30V and 1000V AC.

FIGS. 1A-E show various transport climate control systems. It will be appreciated that the embodiments described herein are not limited to the examples provided below, but can apply to any type of transport unit (e.g., a truck, a container (such as a container on a flat car, an intermodal container, a marine container, a less-than-load container, etc.), a box car, a semi-tractor, a passenger vehicle, or other similar transport unit), etc.

FIG. 1A illustrates one embodiment of an intermodal container 10 with a transport climate control system 15 and a power system 20. The intermodal container 10 can be used across different modes of transport including, for example, ship, rail, tractor-trailer, etc.

The transport climate control system 15 includes a CCU 25 that provides climate control (e.g. temperature, humidity, air quality, etc.) to a climate controlled space 12 of the intermodal container 10. The climate control system 15 also includes a programmable climate controller 30 and one or more sensors (not shown) that are configured to measure one or more parameters of the climate control system 15 (e.g., an ambient temperature outside of the intermodal container 10, a space temperature within the climate controlled space 12, an ambient humidity outside of the intermodal container 10, a space humidity within the climate controlled space 12, etc.) and communicate parameter data to the climate controller 30.

The CCU 25 is disposed on a front wall 14 of the intermodal container 10. In other embodiments, it will be appreciated that the CCU 25 can be disposed, for example, on a rooftop or another wall of the intermodal container 10. The CCU 25 includes a transport climate control circuit (not shown) that connects, for example, a compressor, a condenser, an evaporator and an expander (e.g., expansion valve) to provide conditioned air within the climate controlled space 12.

The climate controller 30 may comprise a single integrated control unit or may comprise a distributed network of climate controller elements (not shown). The number of distributed control elements in a given network can depend upon the particular application of the principles described herein. The climate controller 30 is configured to control operation of the climate control system 15 including the transport climate control circuit.

The climate control system 15 is powered by the power system 20 that can distribute power to the climate control system 15. In this embodiment, the power system 20 is a generator set disposed on a bottom wall 16 of the intermodal container 10 and electrically connected to one or more components of the climate control system 15 (e.g., a compressor, one or more fans and/or blowers, the climate controller 30, one or more sensors, etc.).

In this embodiment, the power system 20 includes a housing 22 attached to a frame 23 by a mounting assembly 24. The mounting assembly 24 can extend between the housing 22 and cross members 26 that are part of the frame 23. The mounting assembly 24 can be made of a high-strength material (e.g., steel, etc.) to rigidly attach the power system 20 to the intermodal container 10. The power system 20 includes a power system controller 35 that is configured to control operation of the power system 20. Operation of a power system, such as the power system 20, is discussed in further detail below with respect to FIGS. 2-5.

Figure 1B:
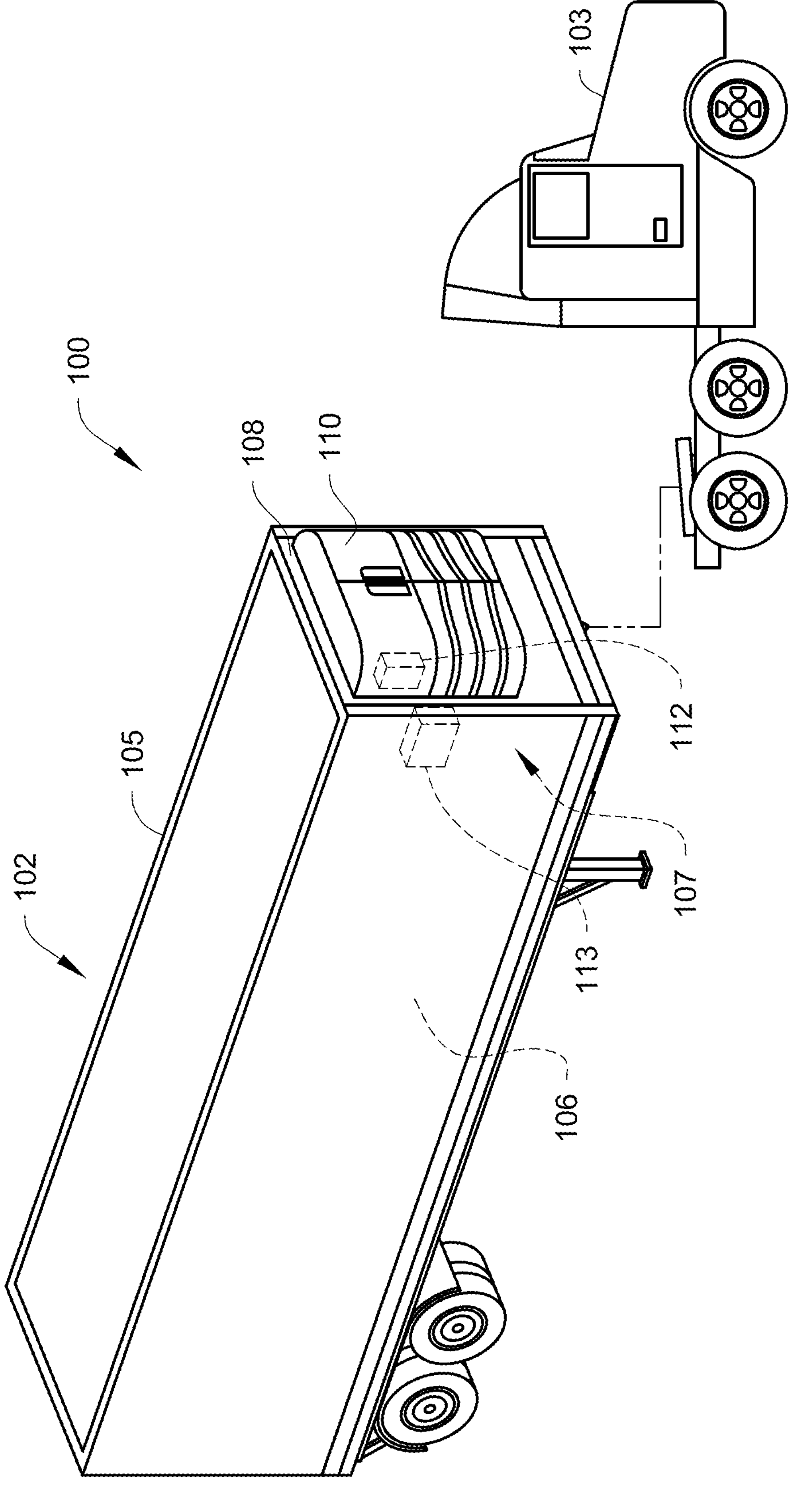
FIG. 1B is a perspective view of a transport climate control unit attached to a tractor, according to one embodiment.

FIG. 1B illustrates one embodiment of a climate controlled transport unit 102 attached to a tractor 103. The climate controlled transport unit 102 includes a climate control system 100 for a transport unit 105. The tractor 103 is attached to and is configured to tow the transport unit 105. The transport unit 105 shown in FIG. 1B is a trailer.

The transport climate control system 100 includes a CCU 110 that provides climate control (e.g. temperature, humidity, air quality, etc.) within a climate controlled space 106 of the transport unit 105. The climate control system 100 also includes a programmable climate controller 107 and one or more sensors (not shown) that are configured to measure one or more parameters of the climate control system 100 (e.g., an ambient temperature outside of the transport unit 105, a space temperature within the climate controlled space 106, an ambient humidity outside of the transport unit 105, a space humidity within the climate controlled space 106, etc.) and communicate parameter data to the climate controller 107.

The CCU 110 is disposed on a front wall 108 of the transport unit 105. In other embodiments, it will be appreciated that the CCU 110 can be disposed, for example, on a rooftop or another wall of the transport unit 105. The CCU 110 includes a transport climate control circuit (not shown) that connects, for example, a compressor, a condenser, an evaporator and an expander (e.g., expansion valve) to provide conditioned air within the climate controlled space 106.

The climate controller 107 may comprise a single integrated control unit 112 or may comprise a distributed network of climate controller elements 112, 113. The number of distributed control elements in a given network can depend upon the particular application of the principles described herein. The climate controller 107 is configured to control operation of the climate control system 100 including the transport climate control circuit.

The climate control system 100 is powered by a power system (see, for example, FIG. 2) that can distribute power to the climate control system 100. In some embodiments, the power system can be a generator set (not shown) attached to the transport unit 105 and electrically connected to one or more components of the climate control system 100 (e.g., a compressor, one or more fans and/or blowers, the climate controller 107, one or more sensors, etc.). Operation of a power system is discussed in further detail below with respect to FIGS. 2-5.

Figure 1C:
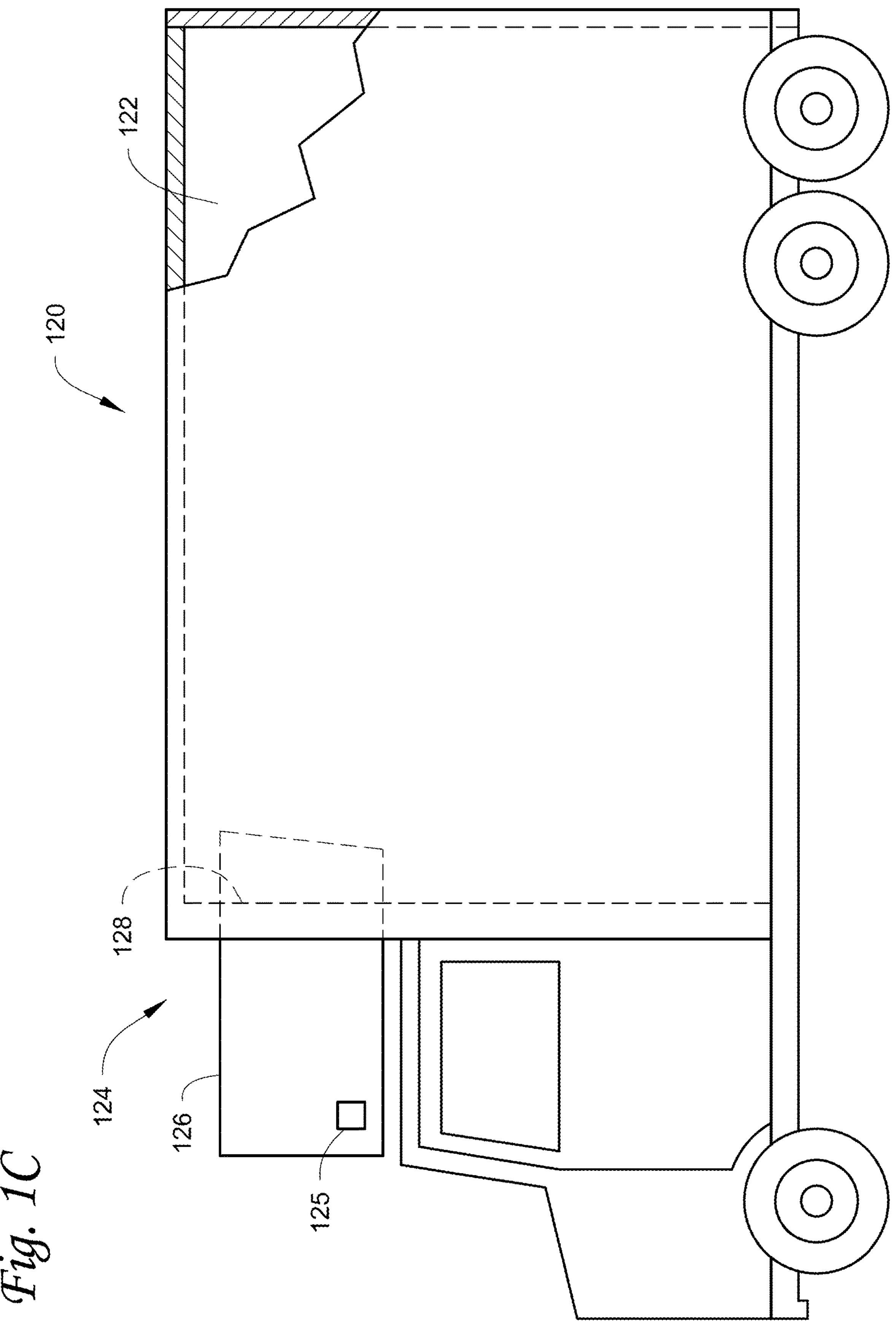
FIG. 1C is a side view of a truck with a transport climate control system, according to one embodiment.

FIG. 1C is a side view of a truck 120 with a transport climate control system 124, according to an embodiment. The truck 120 includes a climate controlled space 122 for carrying cargo. The transport climate control system 124 includes a CCU 126 that is mounted to a front wall 128 of the climate controlled space 122. The CCU 126 can include, among other components, a climate control circuit (not shown) that connects, for example, a compressor, a condenser, an evaporator, and an expander (e.g., expansion valve) to provide climate control within the climate controlled space 122. In an embodiment, the CCU 126 can be a transport refrigeration unit, or the like.

The transport climate control system 124 also includes a programmable climate controller 125 and one or more climate control sensors (not shown) that are configured to measure one or more parameters of the transport climate control system 124 (e.g., an ambient temperature outside of the truck 120, an ambient humidity outside of the truck 120, a compressor suction pressure, a compressor discharge pressure, a supply air temperature of air supplied by the CCU 126 into the climate controlled space 122, a return air temperature of air returned from the climate controlled space 122 back to the CCU 126, a humidity within the climate controlled space 122, etc.) and communicate climate control data to the climate controller 125. The one or more climate control sensors can be positioned at various locations outside the truck 120 and/or inside the truck 120 (including within the climate controlled space 122).

The climate controller 125 is configured to control operation of the transport climate control system 124 including components of the climate control circuit. The climate controller 125 may include a single integrated control unit or may include a distributed network of climate controller elements (not shown). The number of distributed control elements in a given network can depend upon the particular application of the principles described herein. The measured parameters obtained by the one or more climate control sensors can be used by the climate controller 125 to control operation of the climate control system 124.

The climate control system 124 can be powered by a power system (see, for example, FIGS. 2-5) that can distribute power to the climate control system 124. In some embodiments, the power system can be a generator set (not shown) attached to the truck 120 and electrically connected to one or more components of the climate control system 124 (e.g., a compressor, one or more fans and/or blowers, the climate controller 125, one or more sensors, etc.). Operation of a power system is discussed in further detail below with respect to FIGS. 2-5.

Figure 1D:
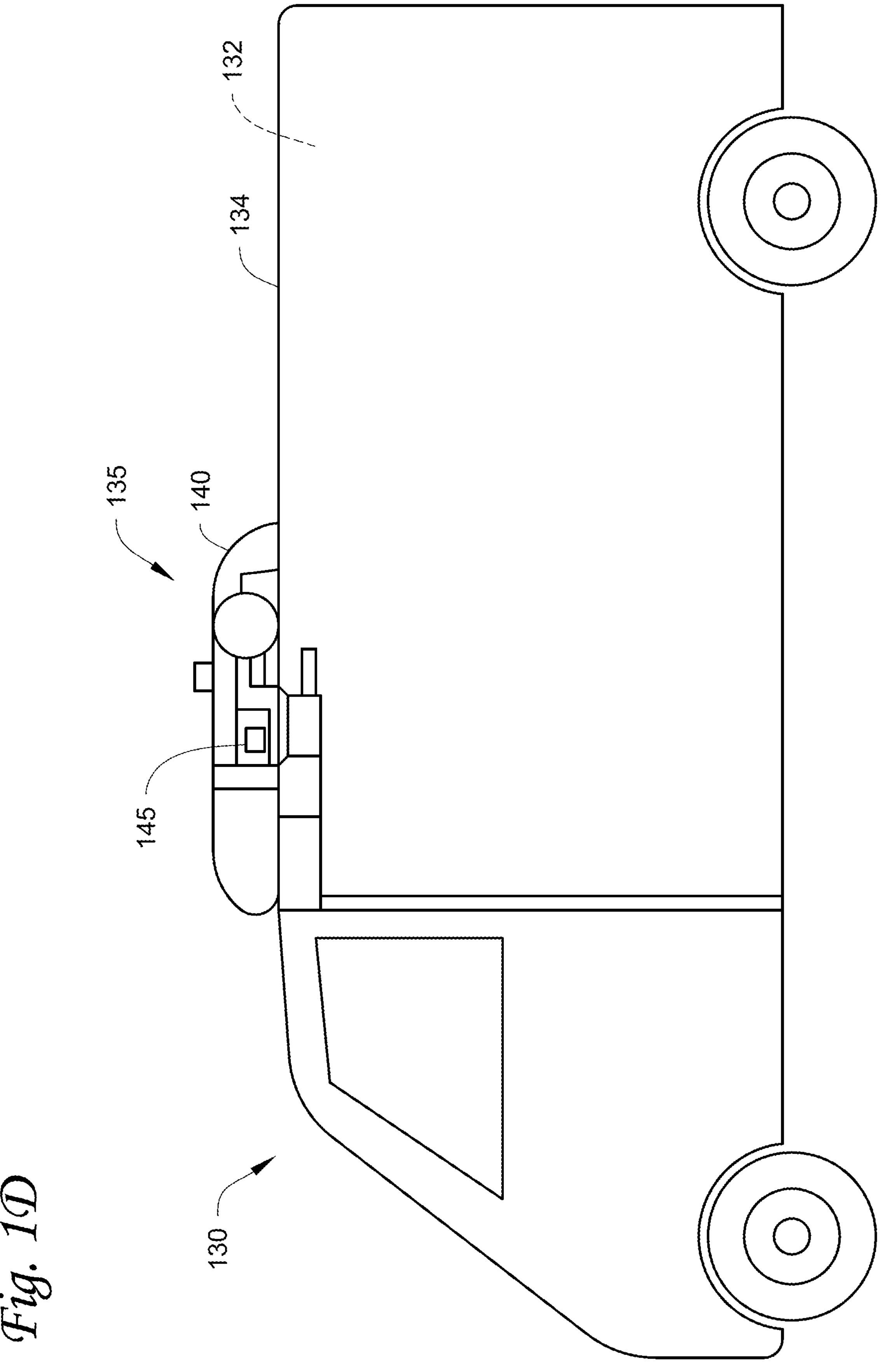
FIG. 1D is a side view of a van with a transport climate control system, according to one embodiment.

FIG. 1D depicts a side view of a van 130 with a transport climate control system 135 for providing climate control within a climate controlled space 132, according to one embodiment. The transport climate control system 135 includes a CCU 140 that is mounted to a rooftop 134 of the van 130. In an embodiment, the CCU 140 can be a transport refrigeration unit, or the like. The climate control system 135 also includes a programmable climate controller 145 and one or more sensors (not shown) that are configured to measure one or more parameters of the climate control system 135 (e.g., an ambient temperature outside of the van 130, a space temperature within the climate controlled space 132, an ambient humidity outside of the van 130, a space humidity within the climate controlled space 132, etc.) and communicate parameter data to the climate controller 145.

The transport climate control system 135 can include, among other components, a transport climate control circuit (not shown) that connects, for example, a compressor, a condenser, an evaporator, and an expander (e.g., an expansion valve) to provide climate control within the climate controlled space 132.

The climate controller 145 may comprise a single integrated control unit or may comprise a distributed network of climate controller elements (not shown). The number of distributed control elements in a given network can depend upon the particular application of the principles described herein. The climate controller 145 is configured to control operation of the climate control system 135 including the transport climate control circuit.

The climate control system 135 is powered by a power system (see, for example, FIG. 2) that can distribute power to the climate control system 135. In some embodiments, the power system can be a generator set (not shown) attached to the van 130 and electrically connected to one or more components of the climate control system 135 (e.g., a compressor, one or more fans and/or blowers, the climate controller 145, one or more sensors, etc.). Operation of a power system is discussed in further detail below with respect to FIGS. 2-5.

Figure 1E:
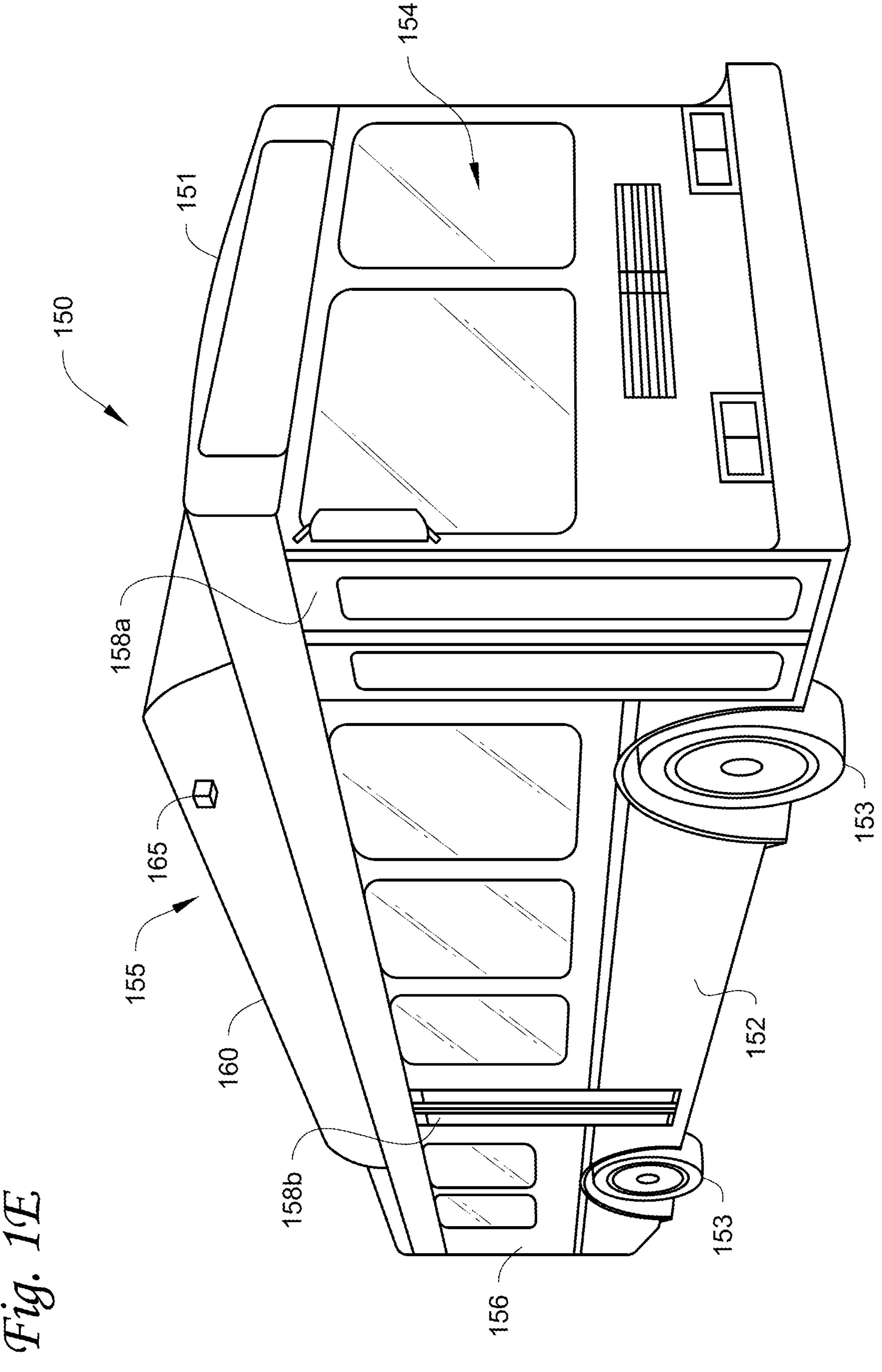
FIG. 1E is a perspective view of a passenger vehicle including a transport climate control system, according to one embodiment.

FIG. 1E is a perspective view of a passenger vehicle 150 including a transport climate control system 155, according to one embodiment. In the embodiment illustrated in FIG. 1E, the passenger vehicle 150 is a mass-transit bus that can carry passenger(s) (not shown) to one or more destinations. In other embodiments, the passenger vehicle 150 can be a school bus, railway vehicle, subway car, or other commercial vehicle that carries passengers. Hereinafter, the term "vehicle" shall be used to represent all such passenger vehicles, and should not be construed to limit the scope of the application solely to mass-transit buses. The transport climate control system 155 can provide climate control within a climate controlled space which is a passenger compartment 154 in this embodiment.

The passenger vehicle 150 includes a frame 152, a passenger compartment 154 supported by the frame 152, wheels 153, and a compartment 156. The frame 152 includes doors 158 that are positioned on a side of the passenger vehicle 150. A first door 158*a* is located adjacent to a forward end of the passenger vehicle 150, and a second door 158*b* is positioned on the frame 152 toward a rearward end of the passenger vehicle 150. Each door 158 is movable between an open position and a closed position to selectively allow access to the passenger compartment 154.

The transport climate control system 155 includes a CCU 160 that is mounted to a rooftop 151 of the passenger vehicle 150. In an embodiment, the CCU 160 can be a HVAC unit. The climate control system 155 also includes a programmable climate controller 165 and one or more sensors (not shown) that are configured to measure one or more parameters of the transport climate control system 155 (e.g., an ambient temperature outside of the passenger vehicle 150, a space temperature within the passenger compartment 154, an ambient humidity outside of the passenger vehicle 150, a space humidity within the passenger compartment 154, etc.) and communicate parameter data to the climate controller 165.

The transport climate control system 155 can include, among other components, a transport climate control circuit (not shown) that connects, for example, a compressor, a condenser, an evaporator, and an expander (e.g., an expansion valve) to provide climate control within the passenger compartment 154.

The climate controller 165 may comprise a single integrated control unit or may comprise a distributed network of climate controller elements (not shown). The number of distributed control elements in a given network can depend upon the particular application of the principles described herein. The climate controller 165 is configured to control operation of the climate control system 155 including the transport climate control circuit.

The climate control system 135 is powered by a power system (see, for example, FIG. 2) that can distribute power to the climate control system 135. In some embodiments, the power system can be a generator set (not shown) attached to the passenger vehicle 150 and electrically connected to one or more components of the climate control system 155 (e.g., a compressor, one or more fans and/or blowers, the climate controller 165, one or more sensors, etc.). Operation of a power system is discussed in further detail below with respect to FIGS. 2-5.

The compartment 156 is located adjacent the rear end of the passenger vehicle 150, can include the power system. In some embodiments, the compartment 156 can be located at other locations on the vehicle 150 (e.g., adjacent the forward end, etc.).

Figure 2:
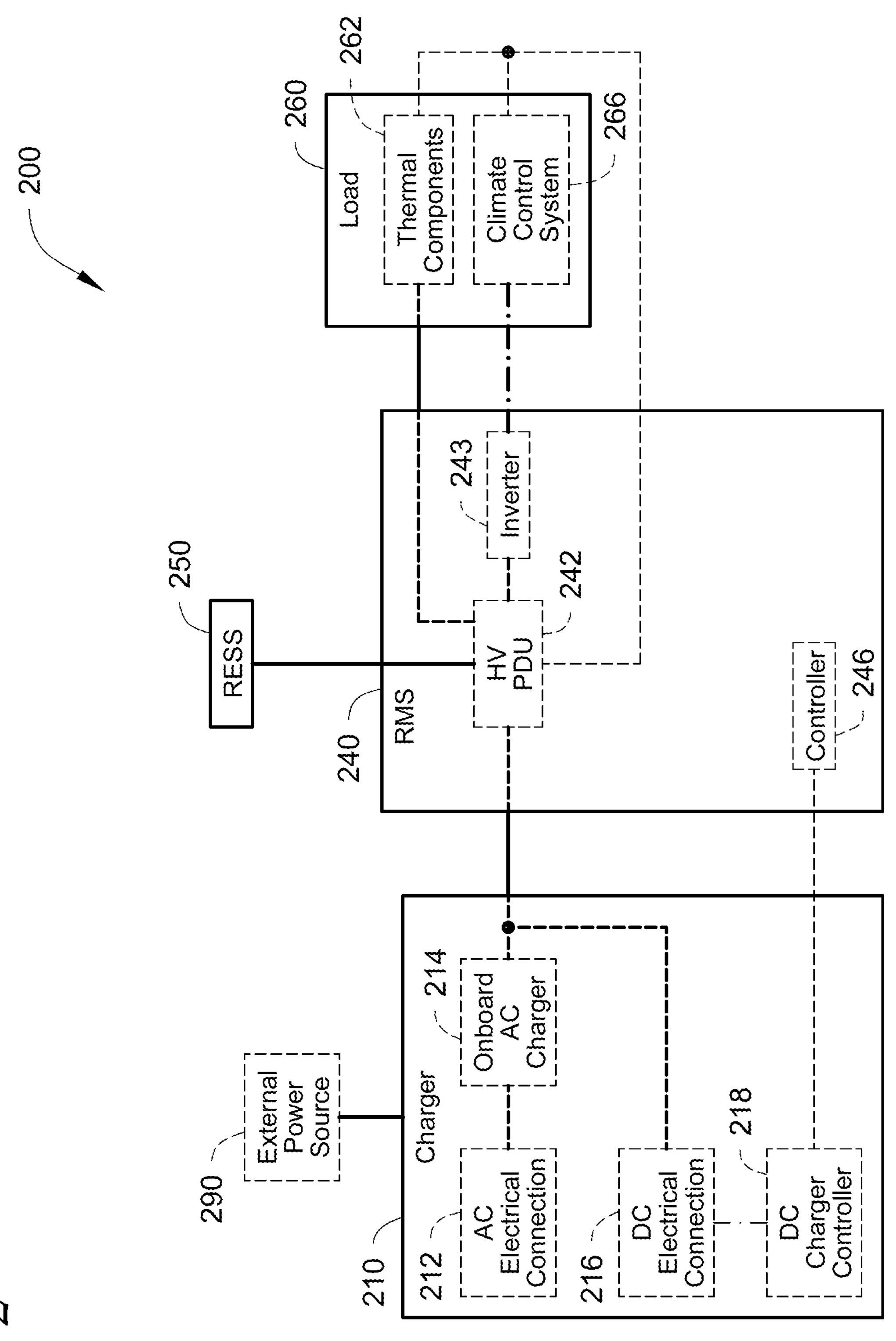
FIG. 2 is a schematic diagram of a power system that can be used to power a transport climate control system, according to one embodiment.

FIG. 2 is a schematic diagram of a power system 200, according to one embodiment. The power system 200 can be any of the power systems described with respect to FIGS. 1A-E above. The power system 200 manages the electrical power for the transport climate control system. In some embodiments, the power system 200 can be a power system for any of the transport climate control system 15, 100, 125, 135, or 155 as shown in FIGS. 1A-E and described above.

The power system 200 supplies some or all the electrical power required by the transport climate control system, during transport and/or stationary at a facility such as a warehouse, a power distribution site (a docking station, a storage, a charging station, a gas station, or the like), a shipyard, a supply yard, a rest stop, a parking infrastructure, or the like. The power system 200 can be transported onboard of the transport unit (e.g., transported with, within, or by the transport unit). When the transport climate control system is connected to an external power source, the power system 200 can be configured to control a current provided from the charger to supply some or all the electrical power drawn by the transport climate control system. During transport, the power system 200 can be configured to supply electrical power stored, or generated onboard to provide some or all the electrical power requested by one or more loads (including one or more loads of the transport climate control system).

In some embodiments, the power system 200 can include a generator set ("genset") that is configured to supply electrical power to one or more loads associated with the transport unit (including one or more loads of the transport climate control system). The one or more loads can include any transport climate control system loads, HVACR system components, lift gates, or the like. Examples of the transport climate control system loads can include, for example, a heater, a fan(s), blower(s), a compressor, a pump, a controller, a telematics unit, an HMI, and/or the like. In some embodiments, a genset can include the combination of a prime mover (e.g., an engine such as a diesel engine) and an electrical machine (e.g., a generator) that can be used to generate electrical power. In some embodiments, a genset can include the combination of RESS (e.g., a battery such as a lithium-ion battery, a nickel-metal hydride battery, a lead acid battery, etc.)), and an inverter that can be used to supply electrical power. In some embodiments, a genset can includes a combination of storage RESS, an inverter, a prime mover, and an electrical machine to supply electrical power to power one or more loads.

As illustrated in FIG. 2, the power system 200 can include a charger 210, a RMS 240, and a RESS 250. The power system 200 can be configured to power one or more loads 260.

The charger 210 is configured to supply electrical power to the power system 200 configured to manage electrical power received from the charger and distribute to the RESS 250 and/or the one or more loads 260. For example, the charger 210 can connect to an external power source 290 for providing electrical power to the power system 200. The external power source 290 can be a direct current (DC) and/or an alternating current (AC) power source. The external power source 290 can be a power source externally from the power system such as an electrical grid power, utility power, shore power, a power station, a generator (e.g., a gas or diesel generator), or the like. For example, the charger 210 can connect to the external power source 290 at a facility such as a warehouse, a power distribution site (a docking station, a storage, a charging station, a gas station, or the like), a shipyard, a supply yard, a rest stop, a parking infrastructure, or the like. In an embodiment, the external power source 290 can include an electrical machine configured to supply three phase AC power.

In some embodiments, the charger 210 can include an electrical connector configured to couple the charger 210 to the external power source 290. In an embodiment, the charger 210 can include an electrical connector configured to correspond to the external power sources 290 such that an AC electrical connector may be provided for an AC external power source, and a DC connector may be provided for a DC electrical power source. In an embodiment, the electrical connecter of the charger 210 can include an optional AC electrical connection 212 (e.g., an AC plug) configured to couple the charger 210 to the external power source 290 when the external power source is configured to supply high voltage three-phase current. The optional AC electrical connection 212 can connect an onboard AC charger 214 to the external power source 290. The onboard AC charger 214 can be configured to modulate current received from the external power source 290. In an embodiment, the onboard AC charger 214 is configured to convert three-phase AC power from, for example, an electrical machine of a genset into DC power that can be used to charge the RESS 250 and/or power the one or more loads 260.

In an embodiment, the charger 210 can include an optional DC electrical connection 216 (e.g., a DC plug) configured to couple the charger 210 to the external power source 290 when the external power source 290 is configured to supply high voltage direct current. The optional DC electrical connection 216 can be in communication with a DC charger controller 218 that is configured to modulate the current received from the external power source 290 and provide the current to the RMS 240.

It is appreciated that high voltage power source can have a voltage at or about 460V AC, 800V DC, or the like. In an embodiment, the RESS 250 may be a high voltage power source. It is further appreciated that in some embodiments the charger 210 may be configured to include both the AC electrical connection 212 connected to the onboard AC charger 214, and the DC electrical connection 216 connected to the DC charger controller 218, to receive both AC and DC power.

The charger 210 is configured to be adaptively coupled to the RMS 240. When the RMS 240 is operating in a charging mode to charge the RESS 250, the charger is enabled (e.g., the charger 210 is currently connected to the RMS 240). In some embodiments, when the RMS 240 is operating in a discharging mode such that the RESS 250 is configured to power the one or more loads 260, the charger 210 may be disabled (e.g., the charger 210 is currently disconnected to the RMS 240). In some embodiments, when the RMS 240 is operating in a discharging mode such that the RESS 250 is configured to power the one or more loads 260, the charger 210 may be enabled (e.g., the charger 210 is currently connected to the RMS 240).

The RMS 240 is configured to modulate the flow of electrical power among components associated with the power system 200. In an embodiment, the RMS 240 is configured to modulate the current received from the charger 210 for providing a current to charge the RESS 250 and/or to provide a current to power the one or more loads 260. It is appreciated that current directed by the RMS 240 to charge or discharge the RESS 250 may be referred to herein as a RESS current. It is further appreciated that current directed by the RMS 240 to power the one or more loads 260 may be referred to herein as a load current. It is also appreciated that current directed from the charger 210 to the RMS 240 may be referred to herein as a charger current.

In some embodiments, the RMS 240 can modulate the current from the RESS 250 and direct the modulated current to the one or more loads 260. In the illustrated embodiment, the RMS 240 includes a high voltage power distribution unit (HV PDU) 242, an inverter 243, and a controller 256.

It is appreciated that the RMS 240 may also include a switch, a capacitor, a current meter, a voltage meter, an inductor, a safety component (e.g., fuses, surge protectors, or the like) for operating the power system 200, or the like. Also, the RMS 240 can include, for example, one or more power inverters, a thermal management system, one or more power filters, etc. In some embodiments, the RMS 240 is configured to monitor power demand from the one or more loads 260. For example, when a prime mover is shut off. Also, the RMS 240 is configured to communicate the power demand of the one or more loads 260 to the power system 200.

The HV PDU 242 is configured to distribute electrical power passing through the RMS 240, for example, by distributing current from the charger 210 to the RESS 250 and the one or more loads 260, distributing current from the RESS 250 to the one or more loads 260, or the like. The HV PDU 242 may include one or more ports configured to connect the charger 210, the RESS 250, and/or the one or more loads 260 for distributing electrical power. For example, the HV PDU 242 can be configured to distribute electrical power: provided by the charger 210 to the one or more loads 260 and/or the RESS 250; from the RESS 250 to the one or more loads 260; or the like. In some embodiments, the HV PDU 242 may include a controller having a processor controlling the charger 210, charging or discharging the RESS 260, powering the one or more loads 260, controlling the inverter 243, or the like.

The inverter 243 is configured to convert DC power into AC power. For example, the inverter 243 may convert DC current from the RESS 250 and/or the charger 210 to provide AC current to the one or more loads 260.

The controller 246 is configured to control the RMS 240, the RESS 250, the charger 210, etc. In an embodiment, the controller 246 may be a climate controller that comprises one or more integrated control units and/or one or more distributed network of climate controller elements, as shown and described, e.g., FIG. 1B. In an embodiment, the controller 246 may be a climate controller configured to regulate the climate control conditions provided by the one or more loads 260. The controller 246 may include any of the climate controller as shown and described in FIGS. 1A-E. In an embodiment, additionally, or alternatively, to the controller 246, the RMS 240 can include a controller 246A operatively connected to the RMS 240. While the controller 246A is shown in FIG. 2 inside the RMS 240, it will be appreciated that in other embodiments, the controller 246A can be disposed remotely from the power system 200 and can be configured to communicate with the power system 200 by a wired or wireless communication protocol, e.g., as discussed below.

The RESS 250 is configured to store and/or provide electrical power to the power system 200, for example, to provide electrical power when the external power source 290 is unavailable. In some embodiments, the RESS 250 can include one or more battery cells, battery packs, etc., configured to provide power to the one or more loads 260. The RESS 250 can provide DC power to the one or more loads 260, and in some embodiments, provide AC power from the inverter 243. In some embodiments, the RESS 250 can have a capacity of an approximately 40 kW-hr battery source. In an embodiment, the RESS 250 includes one or more lithium ion batteries. It will be appreciated that the embodiments described herein can prevent the RESS 250 from accepting electrical power after exceeding its designed storage capacity thereby preventing damage to the RESS 250 and the risk of fire or explosion.

The RESS 250 can have a SoC characterizing the amount of power stored in the RESS 250. The SoC may be a percentage relative to a maximum amount of energy that can be stored in the RESS 250. The maximum amount of energy that can be stored in the RESS 250 may be a number of watt-hours or kilowatt-hours characterized by the physical and/or chemical compositions of the RESS. It is appreciated that a desired RESS SoC may not be the maximum SoC of the RESS 250 in order to allow for operational flexibilities, provide safety margins, preserve the lifespan of the RESS 250, and/or the like. The desired SoC of the RESS 250 can vary based on the application. For example, in one embodiment a desired RESS SoC can be 90%.

It is appreciated that the RESS 250 may include a controller for accepting and discharging a RESS current, balancing RESS charges among the RESS cells, providing thermal management, and/or the like. In an embodiment, the controller 246 can include the controller for the RESS 250.

The one or more loads 260 consume electrical power for providing one or more functions of the transport unit and/or the transport climate control system. Functions of the transport climate control system may include heating, cooling, ventilation, operating any devices supporting the operation of climate control components, or the like.

In an embodiment, the one or more loads 260 includes one or more thermal components 262 (e.g., a heater, fan(s), blower(s), a radiator, or the like), one or more transport climate control system components 266 (e.g., a compressor, an evaporator, a condenser, an expander, or the like). In an embodiment, the one or more loads 260 may be powered by the load current through the inverter 243 based on the demand requested by one or more of the loads 260. In an embodiment, the one or more loads 260 may require the current, or portion of the current supplied to the transport climate control system, to be directed from the inverter 243. The inventor 243 can convert DC power to AC power provided to the one or more loads 260. Components of the one or more loads 260 can include e.g., a compressor, a pump, or the like, and may require AC power to function.

Figure 3A:
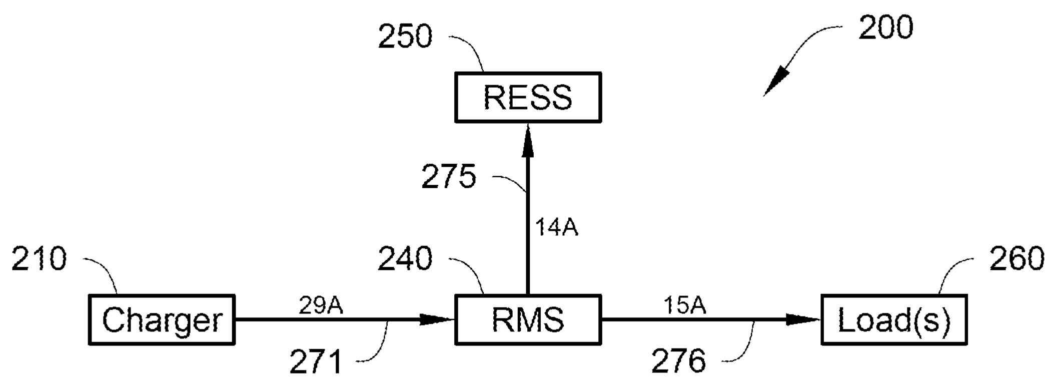
FIG. 3A is a schematic control diagram for the power system shown in FIG. 2 when the power system is powering the load and charging the RESS, according to one embodiment.
Figure 3B:
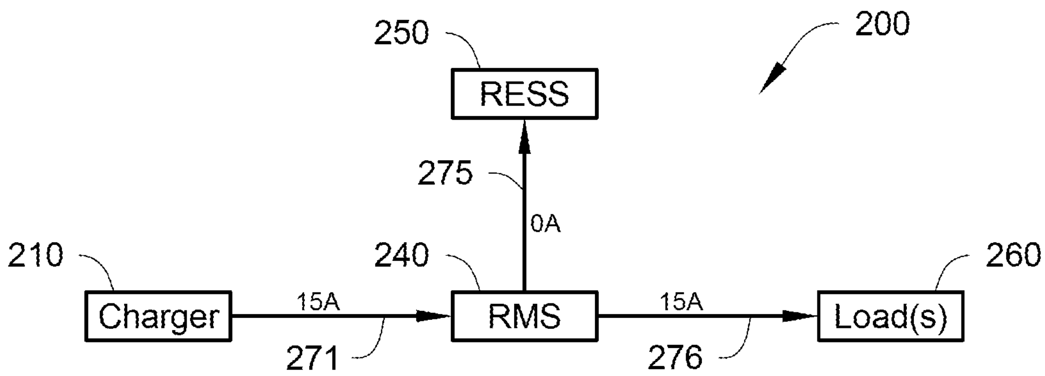
FIG. 3B is a schematic control diagram for the power system shown in FIG. 2 when the power system is powering the load and limiting current to the RESS, according to one embodiment.
Figure 3C:
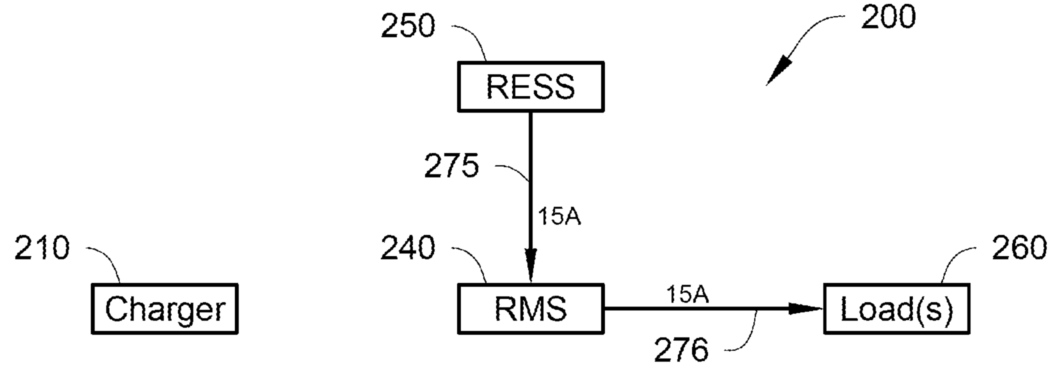
FIG. 3C is a schematic control diagram for the power system shown in FIG. 2 when the RESS is powering the load, according to one embodiment.

FIGS. 3A, 3B, and 3C are schematic control diagrams for the power system 200 as shown in FIG. 2, according to one embodiment.

The power system 200 is configured to power the one or more loads 260 and operatively connect to the charger 210, the RMS 240, the RESS 250, and the one or more loads 260 as shown in FIG. 2 and described above. As illustrated in FIGS. 3A and 3B, the RMS 240 is in electrical communication with the charger 210, the RESS 250, and the one or more loads 260. In an embodiment, the charger 210 supplies current ("charger current") 271 to the RMS 240. The RMS 240 is configured to supply current ("load current") 276 to the one or more loads 260 for powering the one or more loads 260. The RMS 240 can also be configured to supply current ("RESS current") 275 to the RESS 250 for charging the RESS 250.

In some embodiments, while the power system 200 is connected to the external power source 290, the RMS 240 may modulate the current in the power system 200 to charge the RESS 250 and to supply power to the one or more loads 260 by toggling between the charging mode and the discharging mode. For example, in the charging mode, the RMS 240 may use the RESS current 275 for powering the one or more loads 260. Once the state of charge (SoC) of the RESS 250 decreases below a SoC threshold, the RMS 240 can switch to the charging mode to charge the RESS 250. Such an approach may alternate between the charging mode and the discharging mode over a duration when the external power source 290 is providing electrical power to the power system 200 via the charger 210.

The RESS 250 can be charged at any non-negative charge rate (i.e., the RESS current 275 supplied by the RMS 240 can be 0 A, about 0 A, or higher) over a duration when the external power source 290 is capable of providing power to the power system 200 via the charger 210. The RMS 240 can be configured to power the one or more loads 260 with the charger current 271, for example, by matching the load current 276 with the charger current 271.

Once the RESS 250 is charged to a desired RESS SoC, the RMS 240 can be configured to supply a lower or nominal amount of current (e.g., 0 A, or about 0 A), to the RESS 250 for maintaining the desired RESS SoC of the RESS 250 and avoiding overcharging the RESS 250 while keeping the RMS 240 in the charging mode.

It is appreciated that about 0 A may be, for example, less than 2 A, less than 1 A, less than 0.5 A, less than 0.25 A, or the like depending on the application. Accordingly, over a period of time, the lower or nominal amount of RESS current 275 may increase the SoC to above the desired RESS SoC, and the RMS 240 may switch to the discharging mode to reduce the SoC to the desired RESS SoC. Thus, the frequency of switching to discharging mode may be substantially lower than the frequency of switching that can occur when the RMS 240 is constantly switching between discharging RESS 250 (i.e., to power the one or more loads 260) and charging the RESS 250. Comparing to this approach, keeping the power system 200 in a charging mode and occasionally switching to the discharging mode in order to lower the SoC of the RESS 250 can reduce wear and extend the lifespan of the power system 200.

When the power system 200 is in a charging mode as shown in FIGS. 3A and 3B, the charger 210 is configured to supply the charger current 271 to the RMS 240. The RMS 240 is configured to supply the load current 276 to the one or more loads 260. As shown in FIG. 3A, when the RESS 250 is below a desired RESS SoC and excess current is available from the charger 210 (i.e., the charger current 271 is greater than the amount of current being drawn by the one or more loads (260)), the RMS 240 is configured to supply the excess current (i.e., the RESS current 275) to the RESS 250 to increase the SoC of the RESS 250. For example, when the charger current 271 is 29 amps and the current drawn by the one or more loads (260) (i.e., the load current 276) is 15 amps, the excess current of 14 amps (i.e., the RESS current 275) can be supplied by the RMS 240 to charge the RESS 250.

As shown in FIG. 3B, when excess current is not available from the charger 210 (i.e., the charger current 271 is not greater than the amount of current being drawn by the one or more loads (260)) and/or the RESS is at or above a desired RESS SoC, the RMS 240 is configured to limit the transfer of current to the RESS 250 (i.e., limit the RESS current 275) so that substantially all of the charger current 271 received by the RMS 240 is supplied to the one or more loads 260. For example, when the charger current 271 is 15 amps and the current drawn by the one or more loads (260) (i.e., the load current 276) is 15 amps, the RMS 240 limits the amount the RESS current 275 so that the load current 276 substantially matches the charger current 271. It is appreciated that the RMS 240 may determine a total current draw (e.g., a sum of the RESS current 275 and the load current 276) and can be configured to draw the total current draw from the charger 210 (i.e., the charger current 271), or iteratively increase the current draw by a predetermined value (e.g., 0.25 A, 1 A, or the like until a threshold value is met. For example, the threshold value may be a charger current of 0 A or about 0 A. As a result, after the RESS 250 is charged to the desired RESS SoC, the RESS 250 can maintain the desired RESS SoC, and the RMS 240 can be configured to power the one or more loads 260 using electrical power supplied from the charger 210. The RMS 240 can thereby stay in the charging mode and avoid switching between the charging and the discharging mode.

As shown in FIG. 3C, when the power system 200 is in a discharging mode, the RESS 250 is configured to supply the RESS current 275 to the RMS 240 which decreases the SoC of the RESS 250. The RMS 240 is configured to supply the load current 276 to the one or more loads 260. The RESS 250 can provide power to the one or more loads 260 when the external power source is unavailable, for example, during transport. In this embodiment, the charger 210 is not enabled (e.g., the charger 210 is not currently connected to the RMS 240). However, in other embodiments, the charger 210 may be enabled (e.g., the charger 210 may be currently connected to the RMS 240) in the discharging mode.

It is appreciated that the amount of current (e.g., 29A, 14A, 15A, etc.) shown in FIGS. 3A-3C are merely illustrative according to one embodiment. The current values illustrated between the one or more loads 260, the RMS 250, the charger 210, and/or the RESS 250 is not intended to be limiting. The currents can be any values suitable for the power system 200.

Figure 4A:
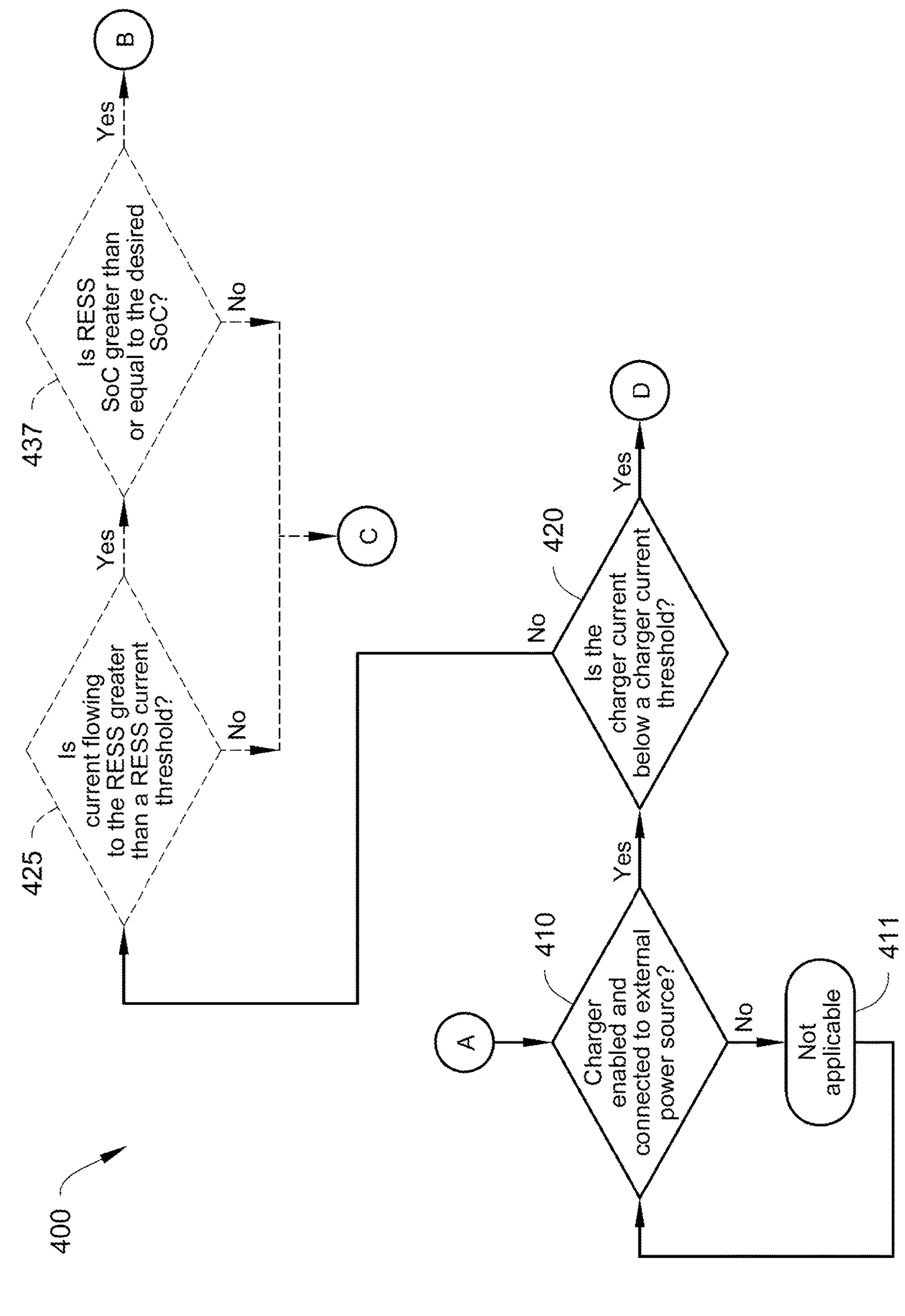
FIG. 4A is a first portion of a flowchart of a method for operating the power system, according to one embodiment.
Figure 4B:
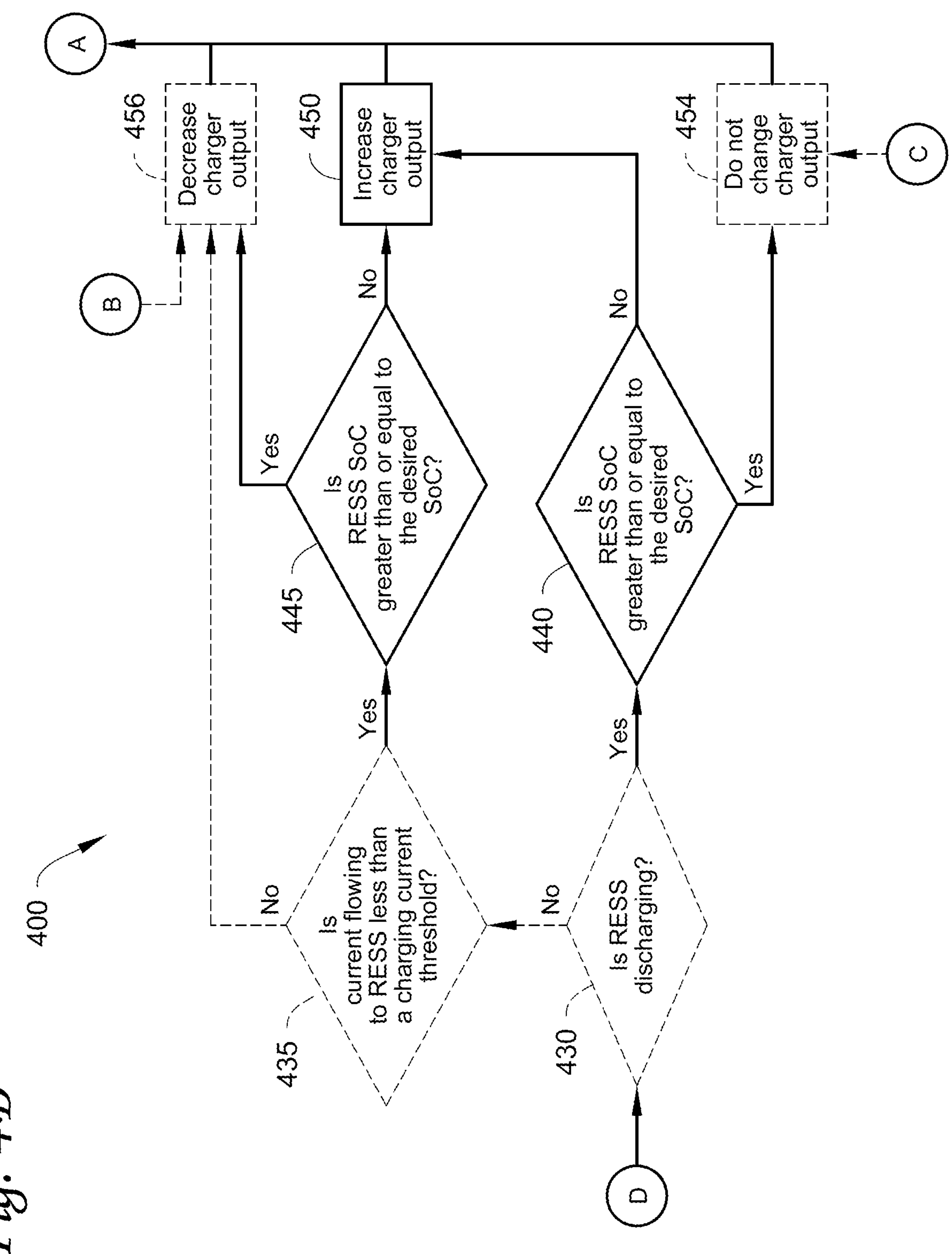
FIG. 4B is a second portion of the flowchart of the method for operating the power system.

The combined FIGS. 4A and 4B show a flowchart of a method 400 for operating a power system (e.g., the power system 200 shown in FIGS. 2, 3A-3C), according to one embodiment. The method 400 can be operated with any of the transport climate control systems 15, 100, 125, 135, or 155 shown in FIGS. 1A-E and described above. In the embodiment described below, the method 400 is performed by a single controller (e.g., the controller 246 of the RMS 250). However, it will be appreciated that in other embodiments, the method 400 can be performed by one or more other controllers (e.g., a controller of a transport climate control system, a controller of the power system, a controller of the RMS, combinations thereof, etc.).

At 410, the controller determines whether the power system is connected to an external power source (e.g., the external power source 290) and whether a charger of the power system (e.g., the charger 210) is enabled (e.g., the charger is currently connected to the RMS). When the controller determines that the power system is connected to the external power source and the charger is enabled, the RMS is set to the charging mode and the method proceeds to 420. When the controller determines that the power system is not connected to an external power source or the charger is disabled, the method proceeds to 411.

At 411, the controller determines that the method 400 is not applicable and the method 400 returns to 410 to continue monitoring changes to whether the power system has been connected to the external power source and whether the charger has been enabled.

At 420, the controller determines whether the charger current is below a predetermined charger current threshold. For example, the method 400 can include comparing the charger current 271 supplied by the charger 210, or drawn by the power system 200, to the charger current threshold. The charger current threshold can be a maximum allowable current value that can be discharged by the charger and/or a maximum allowable current value that can be received by the RMS without potentially damaging the charger or the RMS and/or introducing safety issues. For example, the charger current threshold may be a maximum current value determined by the charger or RMS manufacturer. Exceeding the charger current threshold may damage the charger 210 and/or the RMS 240 and introduce safety issues. In some embodiments, the charger current threshold can be a dynamic value determined by the controller or a static value determined during design of the specific application. Also, in some embodiments, the charger current threshold can be a range (e.g., ±5% of a threshold current value) that can vary based on the application. When the charger current is below the charger current threshold, the method 400 proceeds to 430 (see FIG. 4B). When the charger current is not below the charger current threshold (i.e., the charger current is at or above the charger current threshold), the method 400 proceeds to 425.

At 425, the controller determines whether the current flowing to the RESS from the charger (e.g., the RESS current 275) is greater than a predetermined RESS current threshold. In an embodiment, the predetermined RESS current threshold can be a maximum allowable current value that can be received by the RESS for charging and/or a maximum allowable current that can be discharged from the RMS to the RESS. For example, the RESS current threshold may be a maximum current value determined by the RESS or the RMS manufacturer. The RESS current threshold may include a threshold current value for charging the RESS. In some embodiments, the RESS current threshold can be a dynamic value determined by the controller or a static value determined during design of the specific application. Also, in some embodiments, the RESS current threshold can be a range (e.g., ±5% of a threshold current value) that can vary based on the application. Exceeding the RESS current threshold may damage the RESS and/or the RMS and introduce safety issues.

When the current flowing to the RESS from the charger is not greater than the predetermined RESS current threshold, the method 400 proceeds to 454. When the current flowing to the RESS from the charger is greater than the predetermined RESS current threshold, the method 400 proceeds to 437.

At 437, the controller determines whether the SoC of the RESS is greater than or equal to a desired RESS SoC. In an embodiment, the desired RESS SoC may be a maximum desired RESS SoC determined by the RESS manufacturer, power system assembler, or the like. In some embodiments, the desired RESS SoC can be a dynamic value determined by the controller or a static value determined during design of the specific application. Also, in some embodiments, the desired RESS SoC can be a range (e.g., ±5% of a threshold SoC value) that can vary based on the application. When the RESS SoC is greater than or equal to the desired RESS SoC, the method 400 proceeds to 456. When the RESS SoC is not greater than or equal to the desired RESS SoC, the method 400 proceeds to 454.

At 430, the controller determines whether the RESS is discharging, for example, to supply electrical power to the one or more loads (e.g., the one or more loads 260). It is appreciated that the controller can determine the discharging or charging of the RESS by the controller of the RESS, a current sensor, or the like.

When the controller determines that the RESS is discharging, the method 400 proceeds to 440. When the method 400 determines that the RESS is not discharging, the method 400 proceeds to 435.

At 435, the controller determines whether the current flowing to the RESS from the charger (e.g., the RESS current 275) is less than a charging current threshold. The charging current threshold can be a maximum current allowable to safely charge the RESS. For example, the charging current threshold may be a maximum safe current determined by the RESS or RMS manufacturer. Exceeding the charging current threshold may damage the RESS and/or the RMS and introduce safety issues. In an embodiment, the charging current threshold may be the same as the RESS current threshold at 425. In some embodiments, the charging current threshold can be a dynamic value determined by the controller or a static value determined during design of the specific application. Also, in some embodiments, the charging current threshold can be a range (e.g., ±5% of a threshold current value) that can vary based on the application.

When the current flowing to the RESS from the charger is less than the charging current threshold, the method 400 proceeds to 445. When the current flowing to the RESS from the charger is not less than the charging current threshold, the method 400 proceeds to 456.

At 440 and 445, the controller determines whether the SoC of the RESS is greater than or equal to the desired RESS SoC. In an embodiment, the desired RESS SoC may be a maximum safe SoC determined by the RESS manufacturer, the power system assembler, or the like. In some embodiments, the desired RESS SoC can be a dynamic value determined by the controller or a static value determined during design of the specific application. Also, in some embodiments, the desired RESS SoC can be a range (e.g., ±5% of a threshold SoC value) that can vary based on the application.

At 440, when the SoC of the RESS is greater than or equal to the desired RESS SoC, the method 400 proceeds to 454. When the SoC of the RESS is not greater than or equal to the desired RESS SoC, the method 400 proceeds to 450.

At 445, when the SoC of the RESS is greater than or equal to the desired RESS SoC, the method 400 proceeds to 456. When the SoC of the RESS is not greater than or equal to the desired RESS SoC, the method 400 proceeds to 450.

At 450, the controller increases the charger current (e.g., the charger current 271) output for example, by instructing the charger to increase its current output. In some embodiments, the charger can increase its current output by, for example, a calculated amount based on measured current values. For example, the charger current can be set to the lower of: the maximum current amount the charger can provide; or the maximum current amount the RESS can safely accept added to the current amount being drawn by the load (e.g., the load current 276). In other embodiments, the charger can increase its current by, for example, a predetermined interval (e.g., 0.1 A, 0.2 A, 0.25 A, 0.5 A, 1.0 A, or the like).

At 454, the controller does not change the charger current output.

At 456, the controller decreases the charger current (e.g., the charger current 271) output, for example, by instructing the charger to decrease its current output. In some embodiments, the charger can decrease its current output by, for example, a calculated amount based on measured current values. For example, the charger current can be set to the current amount being drawn by the load (e.g., the load current 276). The current amount drawn by the load can be measured or calculated based on other currents (e.g., the load current 276 added to the RESS current 275). In other embodiments the charger can decrease its current output by, for example, a predetermined interval (e.g., 0.1 A, 0.2 A, 0.25 A, 0.5 A, 1.0 A, or the like).

Following 450, 454 or 456, the method 400 returns to 410 for continuously monitoring and operating the power system, e.g., for responding to changes in power drawn by the one or more loads, changes in the current to the RESS, the SoC, the charger current, and/or the like.

In an embodiment, to increase the charger current output at 450 or to decrease the charger current output at 456, the method 400 may calculate an expected charger current demanded by the power system based on the load current (e.g., the load current 276) and the RESS current (e.g., the RESS current 275). Then, the method 300 can determine a charger setpoint based on the expected charger current and adjust (e.g., increase or decrease) the charger setpoint to provide the expected charger current. Then, the method 300 sets the charger to the charger setpoint determined based on the expected charger current.

In another embodiment, the method 300 may adjust (e.g., increase or decrease) the charger setpoint iteratively by a calculated amount based on current measurements or by a predetermined interval. The predetermined interval may be 2 A or less (e.g., 1 A, 0.5 A, 0.25 A, 0.2 A, 0.1 A, or the like). It is appreciated that each iteration may occur at a predetermined frequency (e.g., 1 iteration per second or quicker) such that the charger 210 may reach the charger setpoint, calculated based on an expected charger current, in an amount of time comparable to the calculated embodiment above.

It is further appreciated that, the power demand from the one or more loads may fluctuate rapidly over time. The iterative approach determines the adjustment in each iteration based on real time SoC, charger current, or the like. Thus, the iterative approach may track the changes in the power demand while generally consuming less computational resources compared the computational approach above. In some embodiments, the power demand from the load(s) can be calculated based on calculating a current demand from the load(s) by subtracting the amount of current directed to the RESS from the amount of current provided by the charger. In some embodiments, the power demand from the load(s) can be calculated by measuring a current drawn by each of the one or more loads.

Figure 5A:
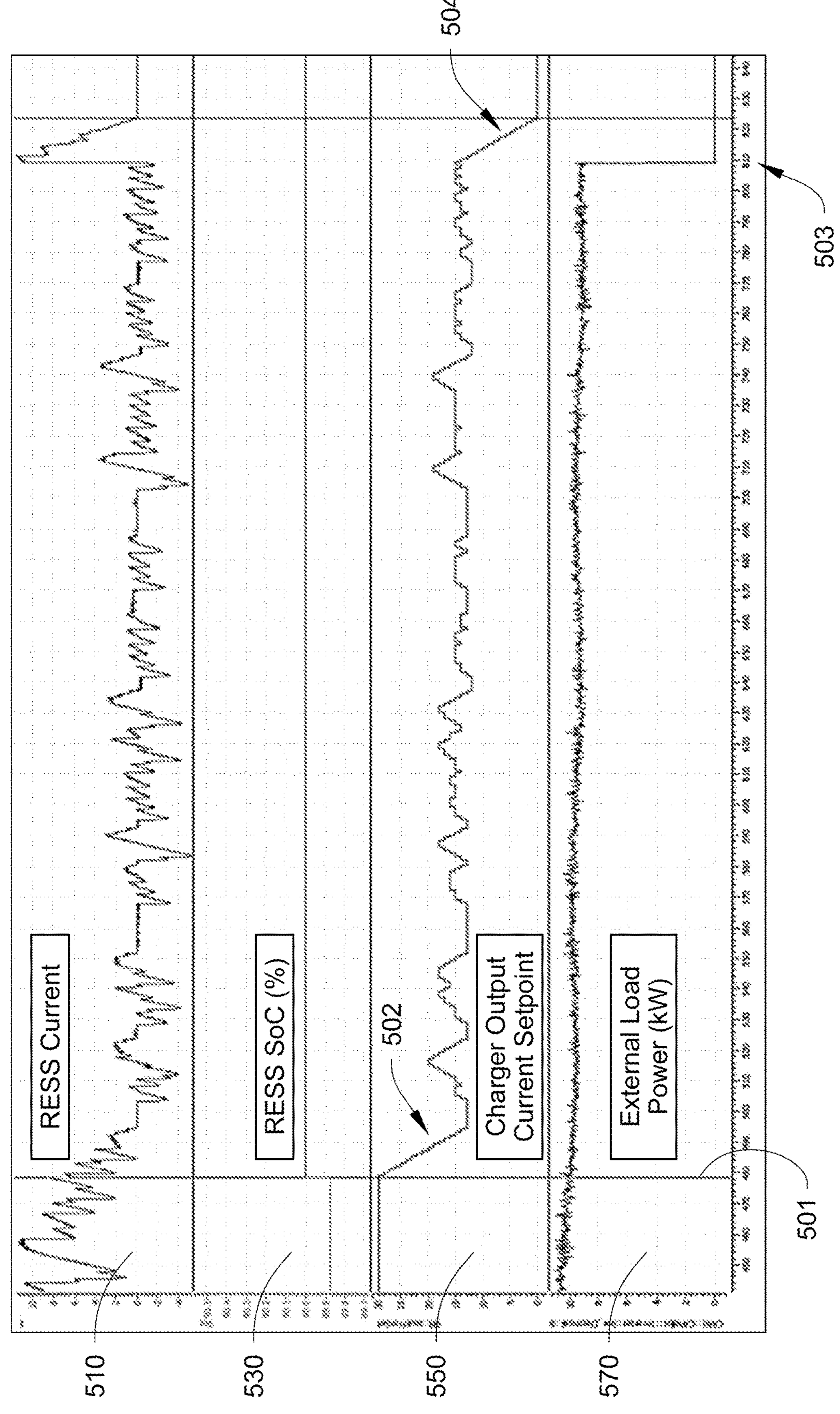
FIG. 5A is a plot of experimental data demonstrating a method of operating the power system that maintains a desired state of charge while ramping down a charger current, according to an embodiment.
Figure 5B:
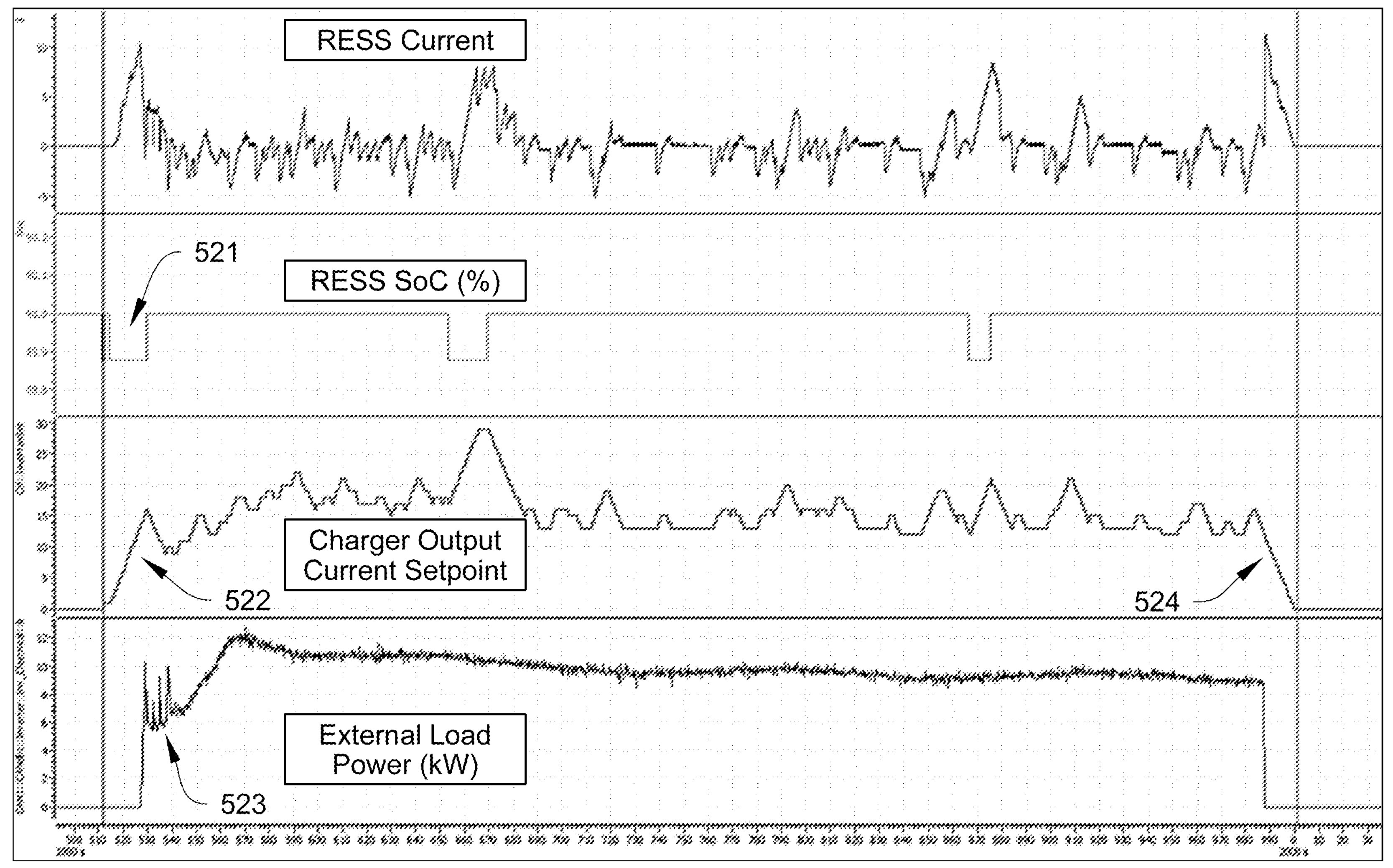
FIG. 5B is a plot of experimental result demonstrating a method of operating the power system that maintains a desired state of charge by ramping up the charger current to support the load, according to an embodiment.

FIGS. 5A and 5B are experimental data demonstrating the method 400, according to an embodiment. The charts of FIGS. 5A and 5B are merely examples that illustrate the corresponding RESS current, RESS SoC, the charger current output, the load(s) demand over a period of time with the power drawn by the load(s) varying over time.

In FIGS. 5A and 5B, the RESS current at 510 are shown in Amps. A positive current value indicates RESS charging. In this embodiment, the RESS is a high voltage battery. A negative current value indicates RESS discharging, e.g., for powering the load(s) (e.g., a transport climate control system).

The RESS SoC at 530 is shown in percentage where 0% denotes the RESS has no useful charge to provide electrical power and 100% denotes the RESS is at or near a desired RESS SoC (e.g., a maximum safe RESS SoC). In the illustrated example, the desired RESS SoC is 90.0%.

The charger current output at 550 is shown in Amps. A positive current value indicates the charger current output being provided to the power system. The load(s) at 570 is shown in kilowatts (kW).

The horizontal axis shows the time in seconds.

FIG. 5A shows the RMS drawing less current (e.g., the charger current) in response to the RESS having reached the desired RESS SoC (e.g., 90%) and the load demand being reduced or shut off.

As shown in FIG. 5A, prior to the time point at 501, the RESS SoC is below 90%. The load(s) draws about 10 kW. The charger current output is at about 30 A. The charger provides current to the RMS to charge the RESS.

At about the time point at 501, the RESS SoC reaches the desired RESS SoC. The charger current output is reduced incrementally at 502 so that the RESS current is reduced to 0 A, or about 0 A, and the load(s) is powered primarily by the charger (via, for example, an external power source) to avoid frequently discharging the RESS. At 503 (about the 810 second point), the load(s) no longer requests power and draws about 0 kW. The charger current output is incrementally reduced at 504 to prevent overcharging of the RESS.

FIG. 5B shows the charger current output being adjusted to meet the power drawn from the load(s) and/or power required for charging the RESS.

As shown in FIG. 5B, at about 521, the RESS SoC drops below 90% where the RESS has a desired RESS SoC of 90%, and the load(s) remains off or is not requesting power. The charger current output is increased incrementally to provide current to the RMS, and the RESS receives a portion of the charger current to charge the RESS.

At about 523, the RESS is charged to the desired RESS SoC and the load(s) is requesting power. Rather than drawing power from the RESS, the charger current output is increased to track power drawn by the load(s). Between about 522 and 524, the charger current output fluctuates and follows a net power draw between the RESS and the load(s) so that discharging the RESS is avoided, or reduced compared to a toggling between a discharging mode and a charging mode approach to powering the load(s).

It is appreciated that the data shown in FIGS. 5A and 5B are data collected from experimental systems. By varying the charger current output to provide power to the load(s) primarily from the charger, rather than by cycling the RESS to discharge and recharge at certain threshold values, the method 400 described in FIGS. 4A and 4B can reduce the number of time toggling between a discharging mode and a charging mode, extend lifespan of the components, or the like. For example, comparing to an approach of cycling the RESS to discharge current to the load(s) until the RESS SoC reaches a threshold (e.g., 85%) and then charging the RESS to a desired RESS SoC (e.g., 90%) for powering to the load(s), to the method 400, the method 400 can maintain the RESS SoC at the desired RESS SoC once the RESS is charged. This can reduce the risk that the RESS is not at the desired RESS SoC when, for example, an operator disconnects the power system from the external power source leading to the operator potentially driving away with less than a sufficiently full charge. Further, by maintaining the RESS in a charging mode while the power system is connected to the external power source, component wear associated with switching between charging and discharging modes can be greatly reduced, extending the expected lifespan of the RMS and the overall power system and ensuring that the RESS is at a desired RESS SoC when there is no electrical connection to an external power source.

Aspects:

It is noted that any of aspects 1-7 can be combined with any one of aspects 8-15.

Aspect 1. A method for operating a power system that is powering a load while the power system is connected to an external power source, the method comprising:
- determining a charger of the power system is connected to the external power source and the charger is enabled;
- modulating a charger current from the charger to a rechargeable energy storage source management system (RMS) of the power system;
- modulating a rechargeable energy storage source (RESS) current provided by the RMS and configured to charge a RESS of the power system;
- monitoring a RESS state of charge (SoC);
- monitoring the RESS current provided by the charger;
- comparing the RESS SoC with a desired RESS SoC threshold; and
- upon the RESS SoC reaching the desired RESS SoC threshold, modulating the charger current for powering the load while avoiding decreasing the RESS SoC.

Aspect 2. The method of aspect 1, further comprising modulating the charger current from the charger to the RMS to supply approximately 0 A for charging the RESS upon determining the RESS SoC is greater than or equal to the desired RESS SoC threshold.

Aspect 3. The method of any one of aspects 1 and 2, further comprising, upon the RESS current discharging while the RESS SoC is below the desired RESS SoC threshold, instructing the charger to increase the charger current output to the RMS.

Aspect 4. The method of any one of aspects 1-3, further comprising instructing the charger to decrease the charger current upon the charger current exceeds a charger threshold.

Aspect 5. The method of any one of aspects 1-4, further comprising instructing the charger to decrease the charger current upon the RESS current exceeding a RESS current threshold.

Aspect 6. The method of any one of aspects 1-5, wherein the RESS comprises a lithium-ion battery.

Aspect 7. The method of any one of aspects 1-6, wherein modulating the charger current includes increasing or decreasing the charger current output by a predetermined interval.

Aspect 8. A power system for powering a load while being connected to an external power source, the power system comprising:

a charger configured to connect the external power source to a rechargeable energy storage source management system (RMS);

the RMS configured to modulate a charger current from the charger, the charger current being configured to provide electrical power to the power system, and configured to modulate a rechargeable energy storage source (RESS) current configured to charge or discharge a RESS;

a RESS configured to provide power to the load; and a controller configured to:

determine that the charger is connected to the external power source and configured to determine that the charger is enabled;

modulate the charger current from the charger to RMS;

modulate the RESS current provided by the RMS and configured to charge a RESS of the power system;

monitor a RESS state of charge (SoC);

monitor the RESS current provided by the charger;

compare the RESS SoC with a desired RESS SoC threshold; and upon the RESS SoC reaching the desired RESS SoC threshold, modulate the charger current for powering the load while avoiding decreasing the RESS SoC.

Aspect 9. The power system of aspect 8, wherein the controller is configured to modulate the charger current from the charger to the RMS to supply approximately 0 A for charging the RESS upon determining the RESS SoC is greater than or equal to the desired RESS SoC threshold.

Aspect 10. The power system of any one of aspects 8 and 9, wherein the controller is configured to, upon the RESS current discharging while the RESS SoC is below the desired RESS SoC threshold, instructing the charger to increase the charger current output to the RMS.

Aspect 11. The power system of any one of aspects 8-10, wherein the controller is configured to instruct the charger to decrease the charger current upon the charger current exceeds a charger current threshold.

Aspect 12. The power system of any one of aspects 8-11, wherein the controller is configured to instruct the charger to decrease the charger current upon the RESS current exceeding a RESS current threshold.

Aspect 13. The power system of any one of aspects 8-12, wherein the RESS comprises a lithium-ion battery.

Aspect 14. The power system of any one of aspects 8-13, wherein the controller is configured to modulate the charger current by increasing or decreasing the charger current output by a calculated amount.

Aspect 15. The power system of any one of aspects 8-14, wherein the load is a transport climate control system.

The terminology used in this Specification is intended to describe particular embodiments and is not intended to be limiting. The terms "a," "an," and "the" include the plural forms as well, unless clearly indicated otherwise. The terms "comprises" and/or "comprising," when used in this Specification, specify the presence of the stated features, integers, steps, operations, elements, and/or components, but do not preclude the presence or addition of one or more other features, integers, steps, operations, elements, and/or components.

With regard to the preceding description, it is to be understood that changes may be made in detail, especially in matters of the construction materials employed and the shape, size, and arrangement of parts without departing from the scope of the present disclosure. This Specification and the embodiments described are exemplary only, with the true scope and spirit of the disclosure being indicated by the claims that follow.

What is claimed is:

1. A method for operating a power system that is powering a load while the power system is connected to an external power source, the method comprising:

determining a charger of the power system is connected to the external power source and the charger is enabled;

monitoring a rechargeable energy storage source (RESS) state of charge (SoC) of a RESS of the power system;

monitoring a RESS current;

a RESS management system (RMS) modulating a charger current from the charger to the RMS, wherein the RMS includes a high voltage power distribution unit configured to distribute electrical power passing through the RMS;

the RMS modulating RESS current, the RESS current being either (i) provided by the RMS to the RESS and configured to charge the RESS of the power system, or (ii) being supplied by the RESS to the RMS and configured to power the load; and the RMS modulating a load current supplied to the load from the RMS via the charger or the RESS.

2. The method of claim 1, further comprising:

determining the RESS SoC is greater than or equal to the desired RESS SoC threshold; and modulating the charger current from the charger to the RMS to supply approximately 0 A for charging the RESS upon determining the RESS SoC is greater than or equal to the desired RESS SoC threshold.

3. The method of claim 1, further comprising:

the RESS current discharging while the RESS SoC is below the desired RESS SoC threshold; and upon the RESS current discharging while the RESS SoC is below the desired RESS SoC threshold, instructing the charger to increase the charger current output to the RMS.

4. The method of claim 1, further comprising instructing the charger to decrease the charger current from the charger to the RMS upon the charger current exceeding a charger threshold.

5. The method of claim 1, further comprising instructing the charger to decrease the charger current upon the RESS current exceeding a RESS current threshold.

6. The method of claim 1, wherein the RESS comprises a lithium-ion battery.

7. The method of claim 1, wherein modulating the charger current includes increasing or decreasing the charger current output by a predetermined interval.

8. A power system for powering a load while being connected to an external power source, the power system comprising:

a charger configured to connect the external power source to a rechargeable energy storage source management system (RMS);

the RMS: a) configured to modulate a charger current from the charger to the RMS, the charger current being configured to provide electrical power to the power system; b) configured to modulate a rechargeable energy storage source (RESS) current configured to charge or discharge a RESS, the RESS current being either (i) provided by the RMS to the RESS and configured to charge the RESS of the power system, or (ii) being supplied by the RESS to the RMS and configured to power the load; and c) configured to modulate a load current supplied to the load from the RMS via the charger or the RESS;

the RESS configured to provide power to the load; and a controller configured to:

determine that the charger is connected to the external power source and configured to determine that the charger is enabled; and monitor a RESS state of charge (SoC) of a RESS;

the RMS configured to monitor the RESS current, wherein the RMS includes a high voltage power distribution unit configured to distribute electrical power passing through the RMS.

9. The power system of claim 8, wherein the controller is configured to:

determine the RESS SoC is greater than or equal to the desired RESS SoC threshold; and modulate the charger current from the charger to the RMS to supply approximately 0 A for charging the RESS upon determining the RESS SoC is greater than or equal to the desired RESS SoC threshold.

10. The power system of claim 8, wherein the controller is configured to determine that the RESS SoC is below the desired RESS SoC threshold, and wherein the controller is configured to, upon the RESS current discharging while the RESS SoC is below the desired RESS SoC threshold, instruct the charger to increase the charger current output to the RMS.

11. The power system of claim 8, wherein the controller is configured to instruct the charger to decrease the charger current from the charger to the RMS upon the charger current exceeding a charger current threshold.

12. The power system of claim 8, wherein the controller is configured to instruct the charger to decrease the charger current upon the RESS current exceeding a RESS current threshold.

13. The power system of claim 8, wherein the RESS comprises a lithium-ion battery.

14. The power system of claim 8, wherein the controller is configured to modulate the charger current by increasing or decreasing the charger current output by a calculated amount.

15. The power system of claim 8, wherein the load is a transport climate control system.

16. The method of claim 1, wherein modulating the charger current, the RESS current, and the load current includes:

determining that the charger current from the charger to the RMS is not below a charger current threshold;

upon determining that the charger current is not below the charger current threshold:

decreasing a charger current output when a) a current flowing from the charger to a RESS is greater than a RESS threshold, and b) when the RESS SoC is greater than or equal to a desired RESS SoC, and maintaining the charger current output when either a) the RESS is not greater than the RESS threshold, or b) the RESS SoC is less than the desired RESS SoC.

17. The method of claim 1, wherein modulating the charger current, the RESS current, and the load current includes:

determining that the charger current is below the charger current threshold;

upon determining that the charger current is below the charger current threshold:

decreasing the charger current when either a) (i) the RESS is not discharging and (ii) the current flowing from the charger to the RESS is less than a charging current threshold, or b) (i) the RESS is not discharging, (ii) the current flowing from the charger to the RESS is less than the charging current threshold, and (iii) the RESS SoC is greater than or equal to the desired RESS SoC, maintaining the charger current output when a) the RESS is discharging, and b) the RESS SoC is greater than or equal to the desired RESS SoC, and increasing the charger current when either a) (i) the RESS is discharging and (ii) the RESS SoC is greater than or equal to the desired RESS SoC, or b) (i) the RESS is not discharging, (ii) the current flowing from the charger to the RESS is less than the charging current threshold, and (iii) the RESS SoC is greater than or equal to the desired RESS SoC.

18. The power system of claim 8, wherein the controller is configured to:

determine that a charger current from the charger to the RMS is not below a charger current threshold; and upon determining that the charger current is not below the charger current threshold:

instruct the charger to decrease a charger current output when a) a current flowing from the charger to a RESS is greater than a RESS threshold, and b) when the RESS SoC is greater than or equal to a desired RESS SoC, and instruct the charger to maintain the charger current output when either a) the RESS is not greater than the RESS threshold, or b) the RESS SoC is less than the desired RESS SoC.

19. The power system of claim 8, wherein the controller is configured to:

determine that the charger current from the charger to the RMS is below a charger current threshold; and upon determining that the charger current is below the charger current threshold:

instructing the charger to decrease the charger current when either a) (i) the RESS is not discharging and (ii) the current flowing from the charger to the RESS is less than a charging current threshold, or b) (i) the RESS is not discharging, (ii) the current flowing from the charger to the RESS is less than the charging current threshold, and (iii) the RESS SoC is greater than or equal to the desired RESS SoC, instructing the charger to maintain the charger current output when a) the RESS is discharging, and b) the RESS SoC is greater than or equal to the desired RESS SoC, and instructing the charger to increase the charger current when either a) (i) the RESS is discharging and (ii) the RESS SoC is greater than or equal to the desired RESS SoC, or b) (i) the RESS is not discharging, (ii) the current flowing from the charger to the RESS is less than the charging current threshold, and (iii) the RESS SoC is greater than or equal to the desired RESS SoC.

* * * * *